United States Patent
Wu

(10) Patent No.: US 10,488,563 B2
(45) Date of Patent: Nov. 26, 2019

(54) DISPLAY SUBSTRATE AND DISPLAY PANEL, METHOD FOR MANUFACTURING THE SAME, AND DISPLAY DEVICE

(71) Applicant: BOE TECHNOLOGY GROUP CO., LTD., Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 14/780,399

(22) PCT Filed: Mar. 27, 2015

(86) PCT No.: PCT/CN2015/075197
§ 371 (c)(1),
(2) Date: Sep. 25, 2015

(87) PCT Pub. No.: WO2016/082396
PCT Pub. Date: Jun. 2, 2016

(65) Prior Publication Data
US 2016/0327693 A1     Nov. 10, 2016

(30) Foreign Application Priority Data

Nov. 26, 2014   (CN) .......................... 2014 1 0696890

(51) Int. Cl.
*G02B 5/00*     (2006.01)
*G02F 1/1335*   (2006.01)
(Continued)

(52) U.S. Cl.
CPC ....... *G02B 5/003* (2013.01); *G02F 1/133512* (2013.01); *G02F 1/133514* (2013.01);
(Continued)

(58) Field of Classification Search
CPC ............. G02F 1/1335; G02F 1/133512; G02F 1/133514; G02F 2201/30; G02F 2201/305;
(Continued)

(56) References Cited

U.S. PATENT DOCUMENTS

| 2008/0158500 A1* | 7/2008 | Kawata | ............. G02F 1/133509 349/187 |
| 2009/0147178 A1* | 6/2009 | Ahn    | .................... G02B 27/2214 349/62 |

(Continued)

FOREIGN PATENT DOCUMENTS

| CN | 101561571 A | 10/2009 |
| CN | 102123866 A | 7/2011  |

(Continued)

OTHER PUBLICATIONS

First Office Action regarding Chinese application No. 201410696890. 4, dated Oct. 10, 2016. Translation provided by Dragon Intellectual Property Law Firm.

(Continued)

*Primary Examiner* — Angela K Davison
(74) *Attorney, Agent, or Firm* — Harness, Dickey & Pierce, P.L.C.

(57) ABSTRACT

The present disclosure discloses a display substrate and a display panel, a method for manufacturing the same and a display device. The method for manufacturing the display substrate includes a step of form an optical grating. The step of forming the optical grating includes: forming an intermediate layer on an outer surface of a transparent base substrate in such a manner that the intermediate layer includes stripe patterns arranged at intervals; forming a display film layer on an inner surface of the transparent base substrate where the intermediate layer is formed; and applying an opaque material onto a surface of the intermediate (Continued)

layer or between the stripe patterns of the intermediate layer on the transparent base substrate, to form light-shielding stripes and light-transmitting stripes which are arranged alternately.

17 Claims, 5 Drawing Sheets

(51) Int. Cl.
H01L 51/52 (2006.01)
H01L 51/00 (2006.01)

(52) U.S. Cl.
CPC .... *G02F 1/133524* (2013.01); *H01L 51/0096* (2013.01); *H01L 51/5275* (2013.01); *H01L 51/5284* (2013.01); *G02F 2001/133562* (2013.01); *Y02E 10/549* (2013.01); *Y02P 70/521* (2015.11)

(58) Field of Classification Search
CPC ............. H01L 51/5275; H01L 51/5284; H01L 51/5262; H01L 51/5282; G02B 5/003; G02B 5/1842; G02B 5/1857; G02B 2005/1804; G02B 27/22; G02B 27/2214; G02B 27/26; H04N 13/0409
USPC ........ 349/15, 110, 111; 359/462; 348/51, 54
See application file for complete search history.

(56) References Cited

U.S. PATENT DOCUMENTS

| | | | |
|---|---|---|---|
| 2009/0152533 A1 | 6/2009 | Chan et al. | |
| 2011/0199549 A1* | 8/2011 | Washizawa | G02B 5/201 349/15 |
| 2011/0285942 A1* | 11/2011 | Guo | G02B 5/008 349/96 |
| 2012/0081776 A1* | 4/2012 | Yeh | G02B 27/2214 359/273 |
| 2012/0099215 A1* | 4/2012 | Wu | G02F 1/133514 359/891 |
| 2012/0207888 A1 | 8/2012 | King | |
| 2013/0321911 A1* | 12/2013 | Yamayoshi | G02B 27/2214 359/462 |
| 2014/0111750 A1 | 4/2014 | Li et al. | |

FOREIGN PATENT DOCUMENTS

| | | |
|---|---|---|
| CN | 202008551 U | 10/2011 |
| CN | 102681176 A | 9/2012 |
| CN | 102981196 A | 3/2013 |
| CN | 202895860 U | 4/2013 |
| CN | 202904128 U | 4/2013 |
| CN | 103454807 A | 12/2013 |
| CN | 203773156 U | 8/2014 |
| CN | 104460100 A | 3/2015 |

OTHER PUBLICATIONS

International Search Report and Written Opinion of the International Searching Authority for international application No. PCT/CN2015/075197, dated Mar. 27, 2015.

Fourth Office Action regarding Chinese Application No. 201410696890.4, dated Oct. 26, 2017. Translation provided by Dragon Intellectual Property Law Firm.

Extended European Search Report regarding Application No. 15766038.2 dated Jun. 27, 2018.

* cited by examiner

DISPLAY SUBSTRATE AND DISPLAY PANEL, METHOD FOR MANUFACTURING THE SAME, AND DISPLAY DEVICE

CROSS-REFERENCE TO RELATED APPLICATIONS

This application is the U.S. national phase of PCT Application No. PCT/CN2015/075197 filed on Mar. 27, 2015, which claims a priority to Chinese Patent Application No. 201410696890.4 filed on Nov. 26, 2014, the disclosures of which are incorporated in their entirety by reference herein.

TECHNICAL FIELD

The present disclosure relates to the field of display technology, and in particular to a display substrate and a display panel, a method for manufacturing the same, and a display device.

BACKGROUND

The manufacture of optical gratings is an important technology in the three-dimensional display and the dual-field-of-view display. The optical grating is composed of a group of light-shielding stripes and light-transmitting stripes among the light-shielding stripes.

In the related art, the optical grating may be formed through photo-etching black photoresist, and one process of forming the optical grating includes: coating black photoresist on a transparent substrate; baking the black photoresist at a high temperature and then curing the black photoresist; exposing the photoresist with a mask plate; and arranging the substrate with the exposed photoresist into a developing solution to develop them, and then the exposed photoresist is reserved and the photoresist which are not exposed is removed, so as to form the light-shielding stripes and light-transmitting stripes among the light-shielding stripes.

In a liquid crystal display device, the optical grating is formed on an outer surface of a liquid crystal display panel so as to make the device light and thin. The liquid crystal display panel includes a color filter substrate and an array substrate that are oppositely arranged to form a cell, and the optical grating may be manufactured on the color filter substrate or the array substrate. Taking an example that the optical grating is manufactured on the color filter substrate, when the optical grating is first manufactured on a base substrate and then the base substrate is inverted to perform a subsequent color filter manufacture and a cell process, a chamber where the subsequent process is performed may be polluted due to black pigments contained in the optical grating. Further, in order to ensure that transmittance of the light shielding areas of the optical grating is low enough, thicknesses of the black stripes is generally in a range of 1 micron to 3 microns, and this may result in that the base substrate may not be absorbed firmly in a subsequent vacuum adsorption process. When the color filter manufacturing and the cell process are completed first and then the optical grating is manufactured on an outer surface of the color filter substrate, the liquid crystal cell may be corroded after being baked at a high temperature and steeped in the developing solution, and the liquid crystals may be denatured under ultraviolet light.

SUMMARY

An object of the present disclosure is to provide a display substrate and a display panel and a method for manufacturing the same, to solve the problem that the display substrate and the display panel and the processes for manufacturing the same may be influenced when manufacturing an optical grating on an outer surface of the display panel.

A display panel and a display device including the display panel are provided in one embodiment of the present disclosure, to improve a yield of the display device.

In view of this, a method for manufacturing a display substrate is provided in one embodiment of the present disclosure, including a step of forming an optical grating. The step of forming the optical grating includes:

forming an intermediate layer on an outer surface of a transparent base substrate, where the intermediate layer includes stripe patterns arranged at intervals;

forming a display film layer on an inner surface of the transparent base substrate where the intermediate layer is formed; and adsorbing opaque materials onto a surface of the intermediate layer or into intervals of the intermediate layer on the transparent base substrate, to form light-shielding stripes and light-transmitting stripes which are alternately arranged.

Optionally, the intermediate layer or the transparent base substrate is treated to produce electric charges on the intermediate layer or the transparent base substrate, to make the intermediate layer or the transparent base substrate capable of absorbing the opaque material.

Optionally, the intermediate layer is made of a transparent organic material or a conductive material.

Optionally, when the intermediate layer is made of the transparent organic material, the outer surface of the transparent base substrate where the intermediate layer is formed is rubbed to make the outer surface charged, to make the transparent base substrate capable of absorbing the opaque material.

Optionally, when the intermediate layer is made of the conductive material, the intermediate layer is applied with a voltage so that the intermediate layer is capable of absorbing the opaque material.

Optionally, the step of forming the intermediate layer on the outer surface of the transparent base substrate further includes:

forming a conductive film layer or an organic film layer on the transparent base substrate; and photo-etching the conductive film layer or the organic film layer, to form the stripe patterns arranged at intervals.

Optionally, the opaque material is carbon powder.

Optionally, the step of applying the opaque material onto the surface of the intermediate layer or between the strip patterns of the intermediate layer on the transparent base substrate includes:

spreading carbon powder onto the transparent base substrate and the intermediate layer, where the carbon powder is absorbed by the intermediate layer or the transparent base substrate to form the light-shielding stripes; and forming the light-transmitting stripes among the light-shielding stripes after removing the carbon powder which is not absorbed.

Optionally, after the step of forming the optical grating, the method further includes:

forming a protection layer on the light-shielding stripes and the light-transmitting stripes.

A display substrate including an optical grating is provided in one embodiment of the present disclosure. The optical grating includes:

an intermediate layer, arranged on an outer surface of a transparent base substrate, where the intermediate layer includes stripe patterns arranged at intervals; and light-shielding stripes including opaque material which covers a surface of the intermediate layer or which is located between the stripe patterns of the intermediate layer and covers the transparent base substrate, and light-transmitting stripes among the light-shielding stripes.

Optionally, the optical grating further includes a protection layer covering the light-shielding stripes and the light-transmitting stripes.

Optionally, the intermediate layer is made of conductive material or transparent organic material.

Optionally, the opaque material is carbon powder.

A method for manufacturing a display panel is further provided in one embodiment of the present disclosure. The display panel includes a first display substrate and a second display substrate that are oppositely arranged to form a cell. The method includes: forming the first display substrate by the above method for manufacturing the display substrate.

Optionally, after the protection layer is formed, the method further includes: arranging oppositely the first display substrate and the second display substrate to form a cell, so as to form the display panel.

Optionally, before applying the opaque material onto the surface of the intermediate layer or between the strip patterns of the intermediate layer on the transparent base substrate, the method further includes: arranging oppositely the first display substrate and the second display substrate to form a cell.

A display panel including the above display substrate is further provided in one embodiment of the present disclosure.

Optionally, the display panel is a liquid crystal display panel including a color filter substrate and an array substrate that are oppositely arranged to form a cell, where the display substrate is the color filter substrate or the array substrate, and the optical grating is arranged on an outer surface of the color filter substrate or an outer surface of the array substrate.

Optionally, the display panel is an organic light emitting diode display panel.

A display device including the above display panel is further provided in one embodiment of the present disclosure.

The present disclosure has the following advantages.

According to the technical solution of the present disclosure, the intermediate layer of stable property is first used to form the stripe patterns arranged at intervals on the outer surface of the transparent base substrate; then, various display film layers are formed on the inner surface of the transparent base substrate where the intermediate layer is formed; finally, the opaque material is absorbed onto the surface of the intermediate layer or into intervals of the intermediate layer on the transparent base substrate, to form light-shielding stripes and light-transmitting stripes of the optical grating which are alternately arranged. The intermediate layer does not need a low enough transmittance, so it is relatively thin, so that the base substrate can be absorbed firmly when forming the display film layers. In addition, because the property of the intermediate layer is stable, the processing chamber may not be polluted by the intermediate layer. Therefore, the process of manufacturing the optical grating may not influence the process of manufacturing the display film layer.

BRIEF DESCRIPTION OF THE DRAWINGS

To make clear technical solutions in embodiments of the present disclosure or the related technology, drawings for the description of the embodiments or the related technology may be described briefly in the following. Obviously, the drawings in the following description are merely a part of the embodiments of the present disclosure, and those skilled in the art may obtain other drawings according to these drawings without creative work.

DETAILED DESCRIPTION

Figure 1:
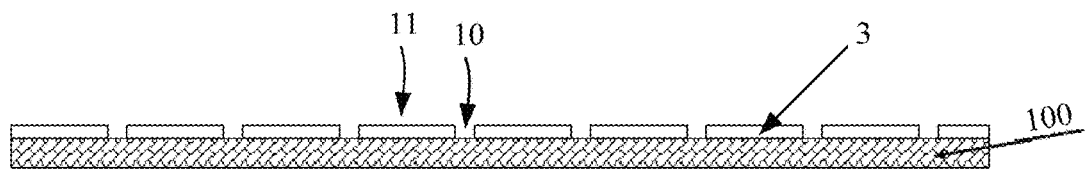
FIGS. 1-4 illustrate a process of manufacturing a liquid crystal display panel according to one embodiment of the present disclosure.

In the related art, when a display substrate and an optical grating are an integrated structure, because light-shielding stripes of the optical grating is made of black photoresist, the light-shielding stripes may be relatively thick, for example, several microns, so as to make transmittance thereof low enough, thus a base substrate may not be absorbed firmly in a subsequent process of forming display film layers. When the display film layer is formed first, a process of manufacturing the optical grating may influence the display film layers.

In view of this, a method for manufacturing a display substrate is provided in the present disclosure, including a step of forming an optical grating. The step of forming the optical grating includes: forming an intermediate layer on an outer surface of a transparent base substrate, where the intermediate layer includes stripe patterns arranged at intervals; forming a display film layer on an inner surface of the transparent base substrate where the intermediate layer is formed; and adsorbing opaque materials onto a surface of the intermediate layer or into the intervals of the intermediate layer on the transparent base substrate, to form light-shielding stripes and light-transmitting stripes which are arranged alternately. Because a transmittance of the intermediate layer is not required to be very low, the intermediate layer is relatively thin, for example, only hundreds of nanometers, thereby a base substrate can be absorbed firmly in a subsequent process of forming the display film layer. In addition, the intermediate layer has stable property, so the intermediate layer may not pollute a processing chamber. Therefore, the process of manufacturing the optical grating may not influence the process of manufacturing the display film layer, thereby making the process easier.

The intermediate layer having stable property means that the intermediate layer has good corrosion resistance and may not be corroded by substances touched by the intermediate layer in the subsequent process. In addition, the intermediate layer and the base substrate are connected firmly, and the intermediate layer may not fall off from the base substrate in the subsequent process, thereby the processing chamber may not be polluted.

Implementation of the present disclosure may be described in details in conjunction with drawings and the embodiments. The followings embodiments are merely to illustrate the present disclosure, but the present disclosure is not limited therein.

A method for manufacturing a display substrate is provided in one embodiment of the present disclosure, including a step of forming an optical grating. The step of forming the optical grating includes: forming an intermediate layer on an outer surface of a transparent base substrate, where the intermediate layer includes stripe patterns arranged at intervals; forming a display film layer on an inner surface of the transparent base substrate where the intermediate layer is formed; and adsorbing opaque materials onto a surface of the intermediate layer or into intervals of the intermediate layer on the transparent base substrate, to form light-shielding stripes and light-transmitting stripes which are arranged alternately.

According to the above steps, the optical grating on the base substrate may be formed in two steps: forming an intermediate layer on an outer surface of a transparent base substrate, where the intermediate layer includes stripe patterns arranged at intervals; and then adsorbing opaque materials onto a surface of the intermediate layer or into the intervals of the intermediate layer on the transparent base substrate, to form light-shielding stripes and light-transmitting stripes. The display film is formed between the two steps, thus one process of manufacturing the optical grating may not influence one process of manufacturing the film layers. Meanwhile, since the intermediate layer has good corrosion resistance, so the intermediate layer may not be corroded in the process of manufacturing the film layers. In addition, the intermediate layer and the base substrate are connected firmly, and the intermediate layer may not fall off from the base substrate and may not pollute the processing chamber. A thickness of the intermediate layer is only hundreds of nanometers, thereby ensuring that the base substrate may be absorbed firmly in the subsequent process.

Correspondingly, a display substrate is further provided in the present disclosure, including an optical grating. The optical grating includes:
an intermediate layer arranged on an outer surface of a transparent base substrate, where the intermediate layer includes stripe patterns arranged at intervals; and
light-shielding stripes including opaque materials covering a surface of the intermediate layer, and light-transmitting stripes among the light-shielding stripes; or, light-shielding stripes including opaque material which is located between the stripe patterns of the intermediate layer and which covers the transparent base substrate, and light-transmitting stripes among the light-shielding stripes.

For a liquid crystal display device, the display substrate may be an array substrate, and the display film layer thereon includes a gate electrode, an active layer, a source electrode and a drain electrode, etc. The display substrate may also be a color filter substrate, and the display film layer thereon includes a black matrix, a color filter layer, etc. For an organic light emitting diodes (OLED) display device, the display film layer on the display substrate includes a negative electrode, a hole-injection layer, a hole-transport layer, an electron-injection layer, an electron-transport layer, a positive electrode, etc.

The transparent base substrate of the display substrate may be, for example, a glass substrate, a quartz substrate or an organic resin substrate, which has a high enough transmittance.

When the intermediate layer is made of transparent material, the stripe patterns of the intermediate layer may be the light-shielding stripe patterns of the optical grating or the light-transmitting stripe patterns of the optical grating. When the stripe patterns of the intermediate layer are the light-shielding stripe patterns of the optical grating, the intermediate layer is capable of absorbing a certain opaque material, and the transparent base substrate is not capable of absorbing the opaque material. When the stripe patterns of the intermediate layer are the light-transmitting stripe patterns of the optical grating, the transparent base substrate is capable of absorbing a certain opaque material, and the intermediate layer is not capable of absorbing the opaque material.

When the intermediate layer is made of non-transparent material, the stripe patterns of the intermediate layer are the light-shielding stripe patterns of the optical grating. The intermediate layer is capable of absorbing a certain opaque material, and the transparent base substrate is not capable of absorbing the opaque material.

To be specific, the intermediate layer or the transparent base substrate is treated to produce electric charges on the intermediate layer or the transparent base substrate, so as to make the intermediate layer or the transparent base substrate capable of absorbing the opaque material. For example, when the intermediate layer is made of conductive material, the intermediate layer is applied with a voltage and then is capable of absorbing the opaque material. When the intermediate layer is made of transparent organic materials, the outer surface of the transparent base substrate where the intermediate layer is formed is rubbed to produce electric charges on the outer surface of the transparent base substrate, so as to make the transparent base substrate capable of absorbing the opaque material.

Furthermore, the opaque material may be carbon powder. The step of applying the opaque material onto the surface of the intermediate layer or between the strip patterns of the intermediate layer on the transparent base substrate includes: spreading the carbon powder on the transparent base substrate and the intermediate layer, wherein the carbon powder is absorbed onto the intermediate layer or the transparent base substrate, so as to form the light-shielding stripes; and forming the light-transmitting stripes among the light-shielding stripes after removing the carbon powder which is not absorbed.

Specifically, the intermediate layer is made of transparent conductive materials, such as indium tin oxide (ITO), indium zinc oxide (IZO). The step of forming the intermediate layer on the outer surface of the transparent base substrate includes: forming a transparent conductive film layer on the transparent base substrate; and photo-etching the transparent conductive film layer, to form stripe patterns arranged at intervals.

In one embodiment, the transparent conductive layer formed in the above steps has light-shielding stripe patterns. Then desired display film layers are formed on an inner surface of the transparent base substrate where the transparent conductive layer is formed. A voltage is applied directly to the transparent conductive layer. Then, carbon powder is spread onto the outer surface of the transparent base substrate where the transparent conductive layer is formed. The charged transparent conductive layer absorbs the carbon powder, thereby forming the light-shielding stripes. The uncharged transparent base substrate does not absorb the carbon powder, thereby forming the light-transmitting stripes among the light-shielding stripes after removing the unabsorbed carbon powder.

Optionally, the intermediate layer may also be made of non-transparent conductive materials such as Al, Cu and other metals or metal alloy. The intermediate layer has the light-shielding stripe patterns, the carbon powder is absorbed onto the light-shielding stripe patterns after applying a voltage thereto, thereby forming the light-shielding stripes, such that the light-shielding stripes of the optical grating may have a low enough transmittance.

The intermediate layer or the transparent base substrate may be made capable of absorbing the opaque materials in other manners according to the technical scheme of the present disclosure, which may also fall into the scope of the present disclosure.

In order to protect the optical grating so as to ensure that the structure of the optical grating is stable, the step of forming the optical grating according to the embodiment of the present disclosure further includes: forming a protection layer on the light-shielding stripes and the light-transmitting stripes of the optical grating.

A method for manufacturing a display panel is further provided in one embodiment of present disclosure. The display panel includes a first display substrate and a second display substrate that are oppositely arranged to form a cell. The first display substrate is formed by the above method for manufacturing the display substrate. That is, the first display substrate includes an optical grating, and a process of manufacturing the optical grating does not influence a process of manufacturing display film layers.

Correspondingly, the display panel manufactured by the above method is not influenced by the process of manufacturing the optical grating.

When the display panel is a liquid crystal display panel, the liquid crystal display panel includes a color filter substrate and an array substrate that are oppositely arranged to form a cell. The first display substrate is the color filter substrate or the array substrate, and the optical grating of the display panel is arranged on an outer surface of the color filter substrate or an outer surface of the array substrate.

FIGS. 1-4 illustrate a process of manufacturing a liquid crystal display panel according to one embodiment of the present disclosure.

As shown in FIGS. 1-4, the process of manufacturing the display panel according to one embodiment of the present disclosure may be described with an example that the optical grating of the liquid crystal display panel is arranged on the outer surface of the color filter substrate. The intermediate layer for forming the optical grating is made of conductive materials and has light-shielding stripe patterns.

At step S10, as shown in FIG. 1, providing a transparent base substrate 100 such as a glass substrate, a quartz substrate or an organic resin substrate; forming a conductive layer 3 on the transparent base substrate 100 in such a manner that the conductive layer 3 has light-shielding stripe patterns 11 of the optical grating and light-transmitting stripe patterns 10 of the optical grating are arranged between adjacent light-shielding stripe patterns 11.

To be specific, a conductive film (such as ITO or IZO transparent conductive film, Al or Cu non-transparent conductive film), with a thickness of hundreds of nanometers, is deposited on the transparent base substrate 100 by means of magnetron sputtering, thermal evaporation or other methods for forming film. Then, photoresist is coated on the conductive film, and the photoresist is exposed with a mask, to form a photoresist reserved area and a photoresist unreserved area. The photoresist reserved area corresponds to an area where the light-shielding stripe patterns 11 are arranged, and the photoresist unreserved area corresponds to an area where the light-transmitting stripe patterns 10 are arranged. And then, the conductive film in the photoresist unreserved area is etched. Finally, the remained photoresist is removed and the conductive layer 3 is formed.

Figure 2:
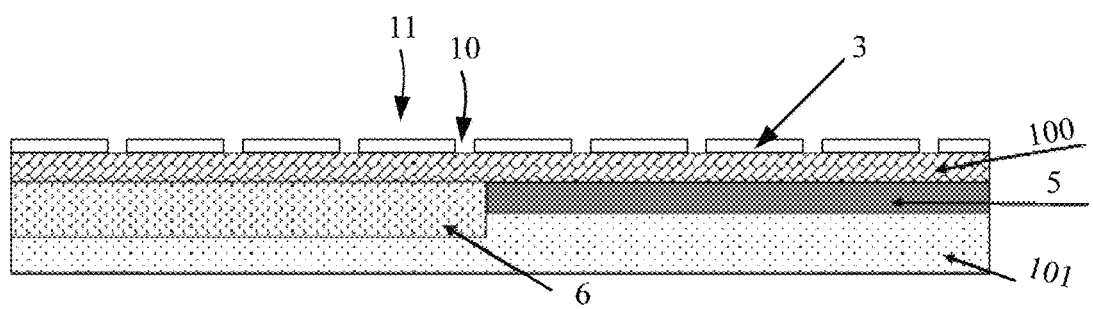

At step S11, as shown in FIG. 2, forming various display film layers on a surface of the transparent base substrate 100 opposite to the transparent conductive layer 3.

The display film layer includes a black matrix 5 configured to define a sub-pixel area; a color filter layer 6 arranged in the sub-pixel area and configured to transmit certain color; and an overcoat layer 101 covering the black matrix 5 and the color filter layer 6.

The materials of the black matrix 5, the color filter layer 6 and the overcoat layer 101 and the manufacturing processes thereof may refer to the related art, and the description thereof is omitted herein.

In addition, the material of the conductive layer 3 has good corrosion resistance, and thus the conductive layer 3 will not be corroded in the process of manufacturing the display film layer. The thickness of the formed conductive layer 3 is only hundreds of manometers, thereby guaranteeing that the transparent base substrate 100 may be absorbed firmly. Compared with the black photoresist in the related art, the conductive layer 3 is connected firmly with the transparent base substrate 100 and is not easy to fall off from the transparent base substrate 100, thus the processing chamber may not be polluted.

Figure 3:
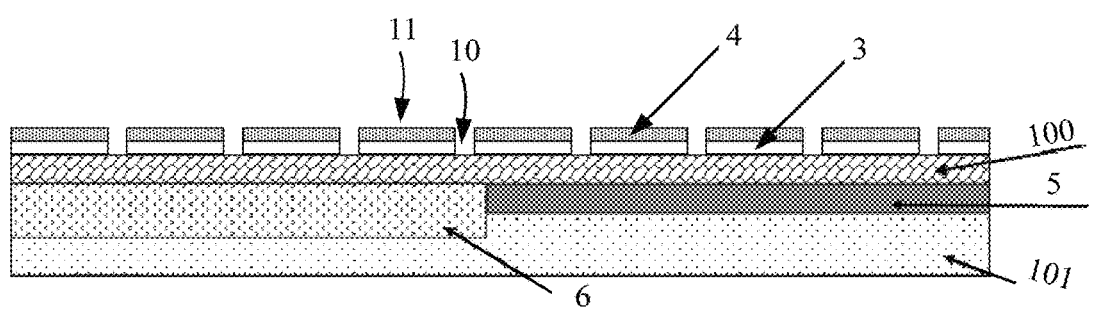

At step S12, applying a voltage to the conductive layer 3 and spreading carbon powder 4 onto the transparent base substrate 100 and the conductive layer 3 in such a manner that the conductive layer 3 adsorbs the carbon powder 4 to form the light-shielding stripes 11, and removing unabsorbed carbon powder to form the light-transmitting stripes 10 on the transparent base substrate 100 between the light-shielding stripes 11, as shown in FIG. 3.

At this point, the manufacturing of one color filter substrate 2 is completed.

Figure 4:
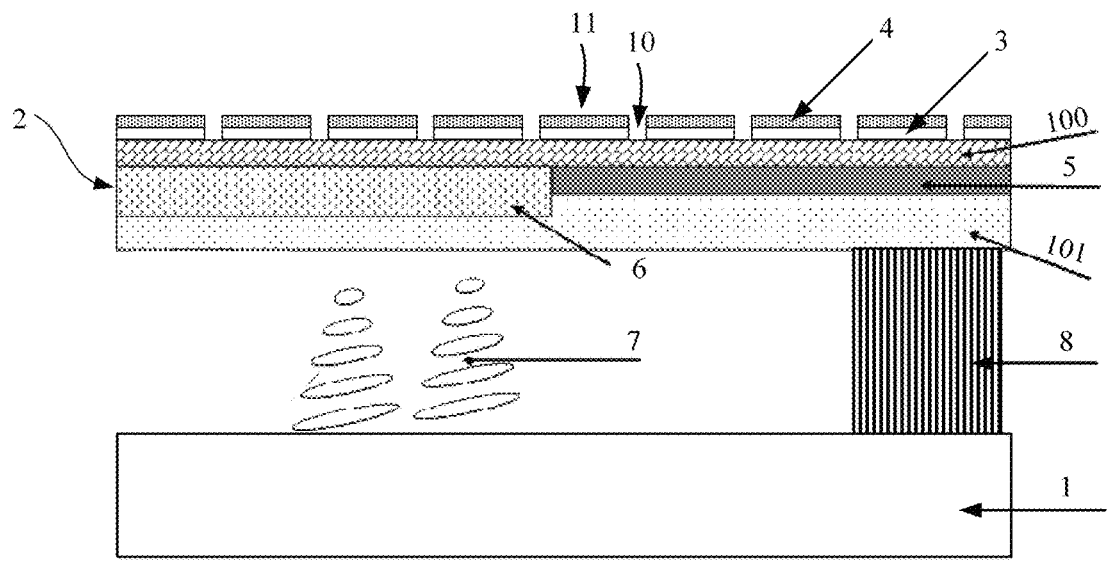

At step S13, as shown in FIG. 4, completing manufacturing of an array substrate 1.

The array substrate 1 may be a thin film transistor array substrate, the manufacturing process thereof may refer to the related art, and the description thereof is omitted herein.

At Step S14, arranging oppositely the array substrate 1 and the color filter substrate 2 to form a cell; instilling liquid crystals 7 into the cell; and sealing the cell by a sealant 8, as shown in FIG. 4. The optical grating is on an outer surface of the color filter substrate 2.

After the cell is formed and the liquid crystals 7 is instilled therein, there is no need to perform one photo-etching process, the liquid crystal panel may not be corroded as a result of a high temperature and being steeped in a developing solution and so on, and the liquid crystals may not be denaturized under ultraviolet light.

At this point, the manufacturing of the liquid display panel is completed.

Figure 5:
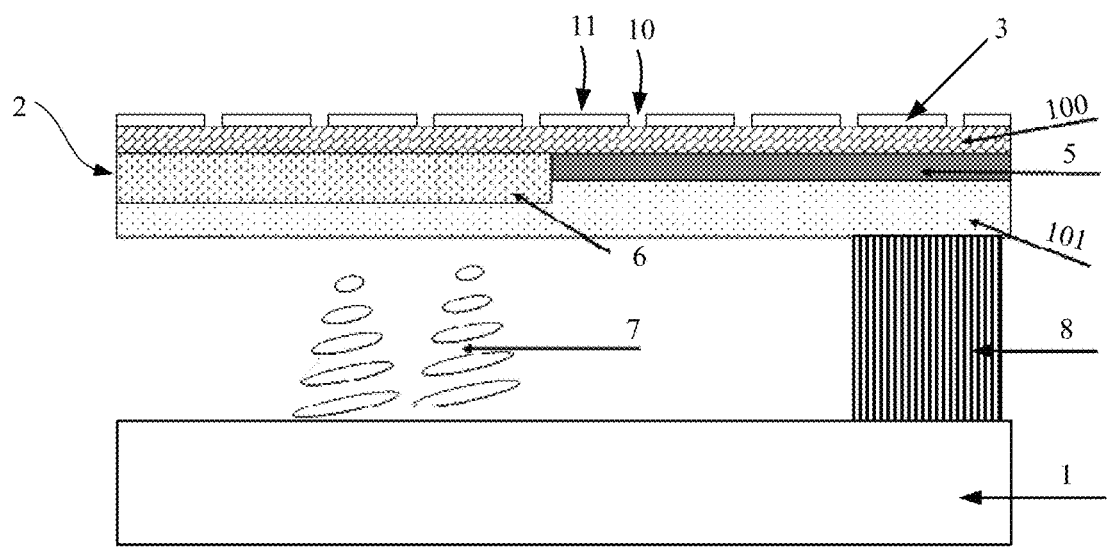
FIG. 5 is a schematic view showing a structure of a cell formed by oppositely arranging a color filter substrate and an array substrate according to one embodiment of the present disclosure.

In the above manufacturing process, it is also feasible to manufacture the array substrate 1 first and then manufacture the color filter substrate 2. It is also feasible to perform the step S14 first to seal the cell formed by arranging oppositely the array substrate 1 and the color filter substrate 2 as shown in FIG. 5 and then perform the step S12 to form the light-shielding stripes of the optical grating, after performing the step S11 to form the display film layers of the color filter substrate 2, so as to complete manufacturing the optical grating.

Figure 6:
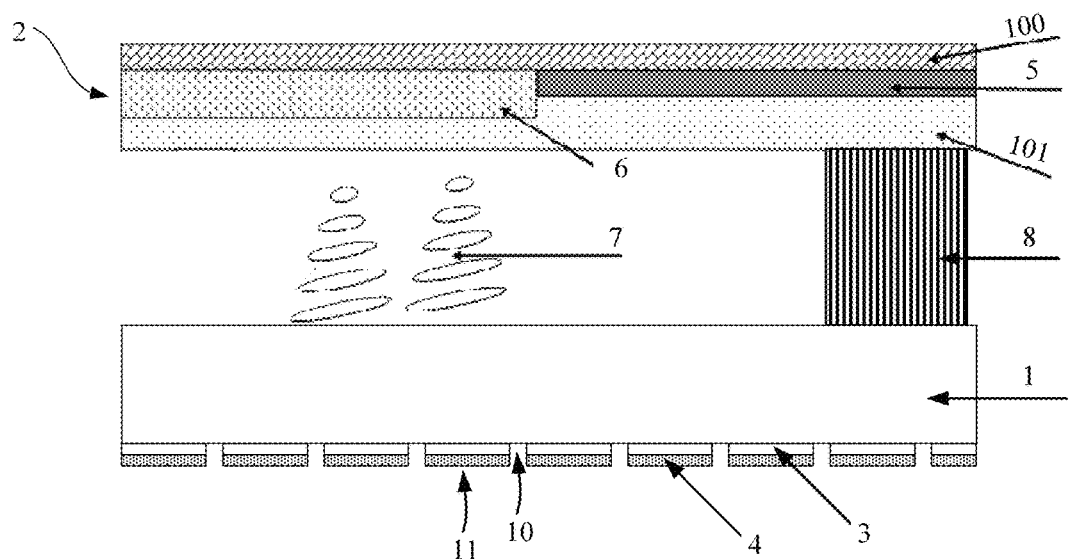
FIG. 6 is a schematic view showing a structure of a liquid crystal display panel according to one embodiment of the present disclosure.

Optionally, the optical grating in the above manufacturing process may also be formed on an outer surface of the array substrate 1, as shown in FIG. 6, and the forming process thereof is similar to the above described process, and the description thereof is omitted herein.

FIGS. 7-10 illustrate a process of manufacturing a liquid crystal display panel according to another embodiment of the present disclosure.

As shown in FIGS. 7-10, an optical grating of a liquid crystal display panel is arranged on an outer surface of a color filter substrate, and light-transmitting stripe patterns of the optical grating are formed by an intermediate layer which is made of transparent organic material. A process of manufacturing the liquid crystal display panel includes following steps.

Figure 7:
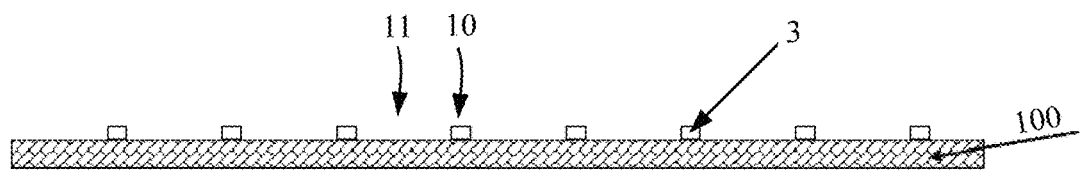
FIGS. 7-10 illustrate a process of manufacturing a liquid crystal display panel according to another embodiment of the present disclosure.

At step S20, as shown in FIG. 7, providing a transparent base substrate 100 such as a glass substrate, a quartz substrate or an organic resin substrate; forming a transparent organic layer 3 on the transparent base substrate 100 in such a manner that the transparent organic layer 3 has light-transmitting stripes 10 of an optical grating and light-shielding stripe patterns 11 of the optical grating are arranged between adjacent light-transmitting stripe patterns 10.

Figure 8:
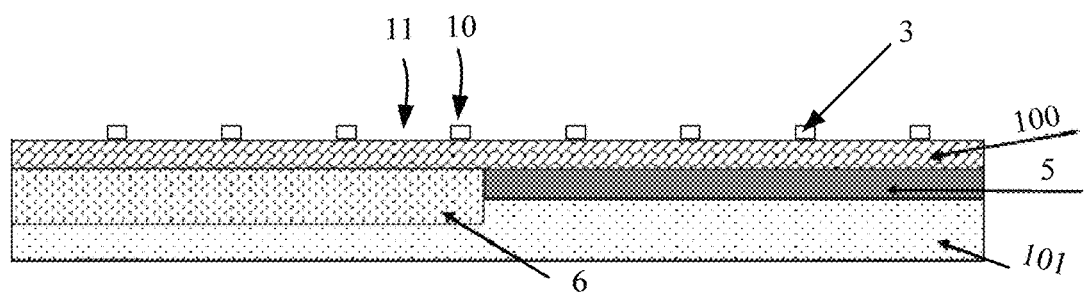

At step S21, as shown in FIG. 8, forming various display film layers on a surface of the transparent base substrate 100 opposite to the transparent organic layer 3.

Figure 9:
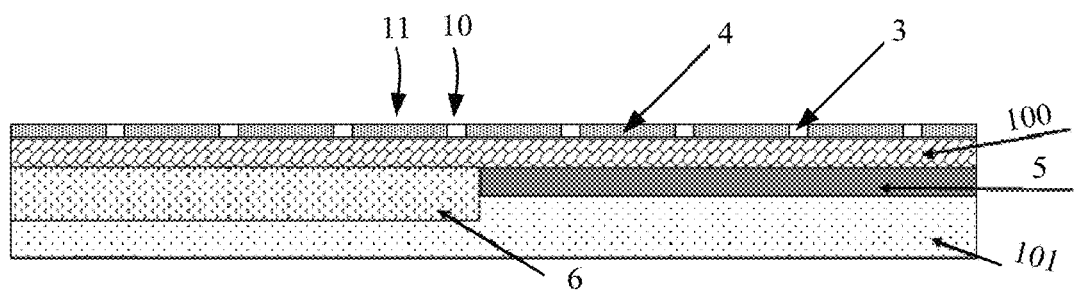

At step S22, rubbing a surface of the transparent base substrate 100 where the transparent organic layer 3 is formed to make the surface charged; spreading carbon powder 4 onto the transparent base substrate 100 and the transparent organic layer 3, so that the charged transparent base substrate 100 adsorbs the carbon powder 4 to form the light-shielding stripes 11; after removing the unabsorbed carbon powder, the uncharged transparent organic layer 3 forms the light-transmitting stripes 10, as shown in FIG. 9.

At this point, the manufacturing of a color filter substrate 2 is completed.

Figure 10:
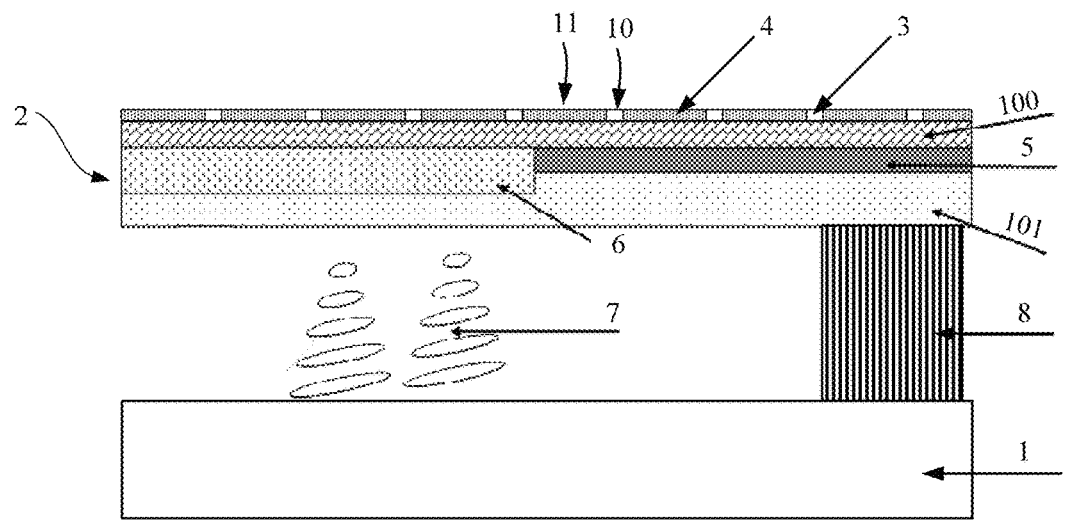

At step S23, completing manufacturing of an array substrate 1, as shown in FIG. 10.

At step S24, arranging oppositely the array substrate 1 and the color filter substrate 2 to form a cell; instilling liquid crystals 7 into the cell; and sealing the cell by a sealant 8, as shown in FIG. 10.

At this point, the manufacturing of the liquid display panel is completed, and the optical grating is on an outer surface of the color filter substrate 2.

Figure 11:
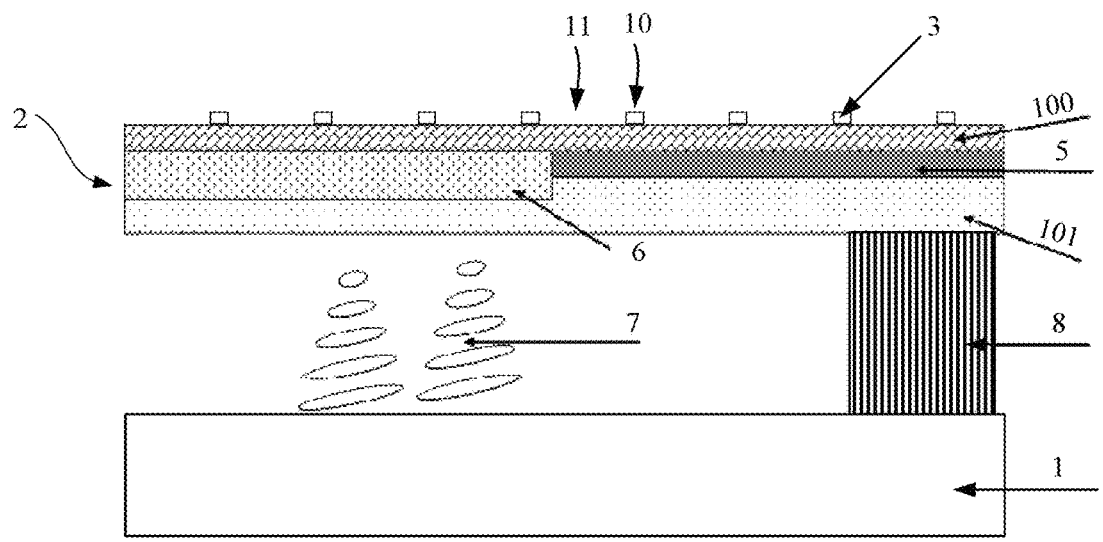
FIG. 11 is a schematic view showing a structure of a cell formed by oppositely arranging a color filter substrate and an array substrate according to another embodiment of the present disclosure.

In the above manufacturing process, it is also feasible to manufacture the array substrate 1 first and then manufacture the color filter substrate 2. It is also feasible to perform the step S24 first to seal the cell formed by arranging oppositely the array substrate 1 and the color filter substrate 2 as shown in FIG. 11 and then perform the step S22 to forming the light-shielding stripes of the optical grating, after performing the step S21 to form the display film layers of the color filter substrate 2, so as to complete manufacturing of the optical grating.

Figure 12:
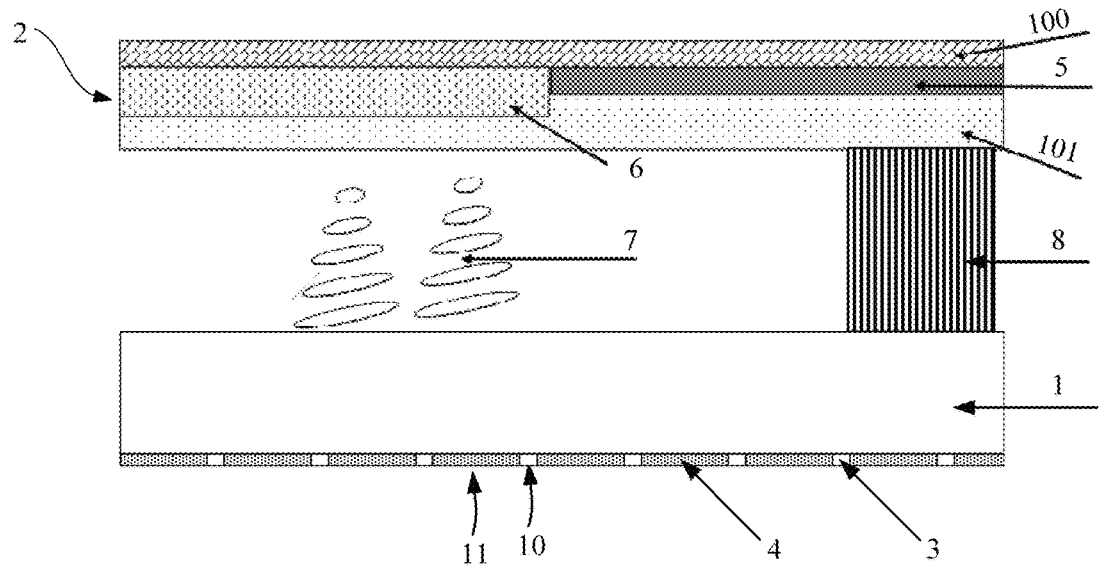
FIG. 12 is a schematic view showing a structure of a liquid crystal display panel according to another embodiment of the present disclosure.

Optionally, the optical grating in the above manufacturing process may also be formed on an outer surface of the array substrate 1, as shown in FIG. 12, the forming process thereof is similar to the above described process, and the description thereof is omitted herein.

The technical solution of the present disclosure is also applicable to an organic light emitting diode display panel, and the process of manufacturing an optical grating therein is similar to the process of manufacturing the optical grating in the liquid crystal display panel, and the difference between the two processes only lies in that an display film layer of the organic light emitting diode display panel includes a negative electrode, a hole-injection layer, a hole-transport layer, an electron-injection layer, an electron-transport layer, a positive electrode, etc, and the manufacturing process thereof may refer to the related art.

A display device is further provided in the present disclosure, including the above display panel, to improve yields of a three-dimensional display device and a dual-field-of-view display device.

According to the technical solution of the present disclosure, the intermediate layer of stable property is first used to form the stripe patterns arranged at intervals on the outer surface of the transparent base substrate; then, various display film layers are formed on the inner surface of the transparent base substrate where the intermediate layer is formed; finally, the opaque material is absorbed onto the surface of the intermediate layer or into intervals of the intermediate layer on the transparent base substrate, to form light-shielding stripes and light-transmitting stripes of the optical grating which are alternately arranged. The intermediate layer does not need a low enough transmittance, so it is relatively thin, so that the base substrate can be absorbed firmly when forming the display film layers. In addition, because the property of the intermediate layer is stable, the processing chamber may not be polluted by the intermediate layer. Therefore, the process of manufacturing the optical grating may not influence the process of manufacturing the display film layer.

The above description is merely optional embodiments of the present disclosure. It should be noted that, several improvements and replacements made by those skilled in the art without departing from the principle of the present disclosure may also fall into the scope of the present disclosure.

What is claimed is:

1. A method for manufacturing a display substrate, comprising a step of forming an optical grating, wherein the step of forming the optical grating comprises: forming an intermediate layer on an outer surface of a transparent base substrate; wherein the intermediate layer comprises stripe patterns arranged at intervals; forming a display film layer on an inner surface of the transparent base substrate where the intermediate layer is formed; and forming light-shielding stripes which are alternately arranged by attaching an opaque material onto a surface of the intermediate layer by generating electric charges on a surface of the intermediate layer or by attaching an opaque material between any two adjacent stripe patterns of the intermediate layer onto the transparent base substrate by generating electric charges on the outer surface of the transparent base substrate, wherein the attached opaque material forms a carbon powder layer, wherein the carbon powder layer consists of carbon powder, and is of a block structure, wherein the stripe patterns each include a major surface that faces the transparent base substrate and an opposing surface that faces away from the transparent base substrate, and the carbon powder layer either directly contacts the opposing surface that faces away from the transparent base substrate or is formed between adjacent stripe patterns in a manner that the opposing surfaces that face away from the transparent base substrate do not cover the carbon powder layer of the light-shielding stripes, wherein optical grating and the display film layer share the same transparent base substrate, and are respectively on two sides of the transparent base substrate, and the optical grating directly contacts the transparent base substrate, and wherein in a case that the display substrate is an array substrate, the display film layer comprises a gate electrode, an active layer, a source electrode and a drain electrode, and in a case that the display substrate is a color filter substrate, the display film layer comprises a black matrix and a color filter layer; wherein the intermediate layer is made of a conductive material so that when the intermediate layer is applied with a voltage, the intermediate layer is capable of attaching the opaque material.

2. The method according to claim 1, wherein the step of forming the intermediate layer on the outer surface of the transparent base substrate further comprises:
   forming a conductive film layer or an organic film layer on the transparent base substrate; and
   photo-etching the conductive film layer or the organic film layer, to form the stripe patterns arranged at intervals.

3. The method according to claim 1, wherein the step of applying the opaque material onto the surface of the intermediate layer or between the strip patterns of the intermediate layer on the transparent base substrate comprises:
   spreading carbon powder onto the transparent base substrate and the intermediate layer; wherein the carbon powder is attracted and attached by the intermediate layer or the transparent base substrate to form the light-shielding stripes; and
   forming light-transmitting stripes among the light-shielding stripes after removing the carbon powder which is not absorbed.

4. The method according to claim 1, wherein after the step of forming the optical grating, the method further comprises: forming a protection layer on the light-shielding stripes and light-transmitting stripes.

5. A method for manufacturing a display panel which comprises a first display substrate and a second display substrate that are oppositely arranged to form a cell, the method comprising:
   forming the first display substrate by the method according to claim 4.

6. The method according to claim 5, wherein after the protection layer is formed, the method further comprises: arranging oppositely the first display substrate and the second display substrate to form a cell, so as to form the display panel.

7. The method according to claim 5, wherein before applying the opaque material onto the surface of the intermediate layer or between the strip patterns of the intermediate layer on the transparent base substrate, the method further comprises: arranging oppositely the first display substrate and the second display substrate to form a cell.

8. A display substrate comprising an optical grating, and the optical grating comprising:
   light-shielding stripe patterns and light-transmitting stripes that are alternately arranged on an outer surface of a transparent base substrate;
   wherein each of the light-shielding stripe patterns comprises a conductive layer and a carbon powder layer, the conductive layer is made of a conductive material, the carbon powder layer consists of carbon powder and is of a continuous structure, the conductive layer and the carbon powder layer are sequentially arranged on the outer surface of the transparent base substrate, and the carbon powder layer directly contacts the conductive layer;
   wherein the conductive layer is configured to attach the carbon powder onto a surface thereof under the attraction of electric charges when the conductive layer is charged;
   wherein the display substrate further comprises a display film layer on an inner surface of the transparent base substrate, the optical grating and the display film layer share the same base substrate, and are respectively on two sides of the base substrate, and the conductive layer of the optical grating directly contacts the base substrate, and
   wherein in a case that the display substrate is an array substrate, the display film layer comprises a gate electrode, an active layer, a source electrode, and a drain electrode, and in a case that the display substrate is a color filter substrate, the display film layer comprises a black matrix and a color filter layer.

9. The display substrate according to claim 8, wherein the optical grating further comprises:
   a protection layer covering the light-shielding stripes and the light-transmitting stripes.

10. A display panel, comprising the display substrate according to claim 8.

11. The display panel according to claim 10, wherein the display panel is a liquid crystal display panel comprising a color filter substrate and an array substrate that are oppositely arranged to form a cell;
   wherein the display substrate is the color filter substrate or the array substrate, and the optical grating is arranged on an outer surface of the color filter substrate or an outer surface of the array substrate.

12. A display device comprising the display panel according to claim 10.

13. The display substrate according to claim 8, wherein an orthographic projection of the conductive layer onto the transparent base substrate overlaps an orthographic projection of the carbon powder layer onto the transparent base substrate.

14. The display substrate according to claim 8, wherein the carbon powder layer is of a continuous block structure.

15. A display substrate comprising an optical grating, the optical grating comprising: light-shielding stripe patterns and light-transmitting stripes that are alternately arranged on an outer surface of a transparent base substrate; each of the light-transmitting stripe patterns is made of a transparent organic material, and each of the light-shielding stripes comprises a carbon powder layer consisting of carbon powder and is of a continuous structure, and the carbon powder layer is attached on the outer surface of the transparent base substrate, wherein the transparent base substrate is configured to attach the carbon powder layer thereon under the attraction of electric charges after being rubbed to electrically charge the outer surface of the transparent base substrate, the light-transmitting stripes include major surfaces that face the transparent base substrate and opposing surfaces that face away from the transparent base substrate, all of the major surfaces are co-planar, and all of the opposing surfaces that face away from the transparent base substrate are co-planar with opposing surfaces of the light-shielding stripes that face away from the transparent base substrate, wherein the display substrate further comprises a display film layer on an inner surface of the transparent base substrate, the optical grating and the display film layer share the same base substrate, and are respectively on two sides of the base substrate, and the optical grating directly contacts the base substrate, and wherein in a case that the display substrate is an array substrate, the display film layer comprises a gate electrode, an active layer, a source electrode and a drain electrode, and in a case that the display substrate is a color filter substrate, the display film layer comprises a black matrix and a color filter layer.

16. The display substrate according to claim 15, wherein the optical grating further comprises:
   a protection layer covering the light-shielding stripes and the light-transmitting stripes.

17. The display substrate according to claim 15, wherein an orthographic projection of the light-transmitting stripe onto the transparent base substrate is non-overlapped with an orthographic projection of the carbon powder layer onto the transparent base substrate.

* * * * *